(12) United States Patent
Neto et al.

(10) Patent No.: US 7,877,710 B1
(45) Date of Patent: Jan. 25, 2011

(54) METHOD AND APPARATUS FOR DERIVING SIGNAL ACTIVITIES FOR POWER ANALYSIS AND OPTIMIZATION

(75) Inventors: David Neto, Toronto (CA); Vaughn Betz, Toronto (CA); Meghal Varia, Brampton (CA); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1060 days.

(21) Appl. No.: 11/414,855

(22) Filed: May 1, 2006

Related U.S. Application Data

(60) Provisional application No. 60/727,639, filed on Oct. 17, 2005.

(51) Int. Cl.
*G06F 17/50* (2006.01)
(52) U.S. Cl. .................. 716/4; 716/1; 716/2; 716/5; 716/6; 716/17; 716/18
(58) Field of Classification Search ............... 716/1, 716/2, 4, 5, 6, 17, 18
See application file for complete search history.

(56) References Cited

U.S. PATENT DOCUMENTS

| | | | |
|---|---|---|---|
| 6,111,432 A * | 8/2000 | Gerber et al. ............... 326/83 |
| 6,397,170 B1 * | 5/2002 | Dean et al. .................. 703/14 |
| 6,470,482 B1 * | 10/2002 | Rostoker et al. .............. 716/6 |
| 6,742,166 B2 * | 5/2004 | Foster et al. ................. 716/4 |
| 6,937,969 B1 * | 8/2005 | Vandersteen et al. ......... 703/14 |
| 6,954,912 B2 * | 10/2005 | Srivastava et al. ............ 716/4 |
| 7,047,101 B1 * | 5/2006 | Young et al. ............... 700/121 |
| 7,051,313 B1 * | 5/2006 | Betz et al. .................. 716/17 |
| 7,134,100 B2 * | 11/2006 | Ravi et al. ................... 716/2 |
| 7,185,300 B2 * | 2/2007 | Frenkil ....................... 716/6 |
| 7,313,773 B1 * | 12/2007 | Braun et al. ................. 716/5 |
| 7,340,700 B2 * | 3/2008 | Emerson et al. .............. 716/4 |
| 7,395,521 B1 * | 7/2008 | Ma et al. .................... 716/18 |
| 7,433,808 B1 * | 10/2008 | Raghavan et al. ............ 703/2 |
| 2003/0212973 A1 * | 11/2003 | Lin et al. ..................... 716/6 |
| 2004/0030430 A1 * | 2/2004 | Matsuoka .................. 700/108 |
| 2004/0044514 A1 * | 3/2004 | Granny et al. .............. 703/23 |
| 2005/0268258 A1 * | 12/2005 | Decker ....................... 716/4 |
| 2008/0282221 A1 * | 11/2008 | Kahlon et al. .............. 717/105 |

OTHER PUBLICATIONS

Czajkowski et al.; "Fast toggle rate computation for FPGA circuits"; Publication Year: 2008; Field Programmable Logic and Applications, 2008. FPL 2008. International Conference on; , pp. 65-70.*

* cited by examiner

*Primary Examiner*—Helen Rossoshek
(74) *Attorney, Agent, or Firm*—L. Cho

(57) ABSTRACT

A method for managing vectorless estimation includes identifying a semantic structure. A signal activity is assigned to an output of the semantic structure. Vectorless estimation is performed on non-semantic structures.

29 Claims, 23 Drawing Sheets

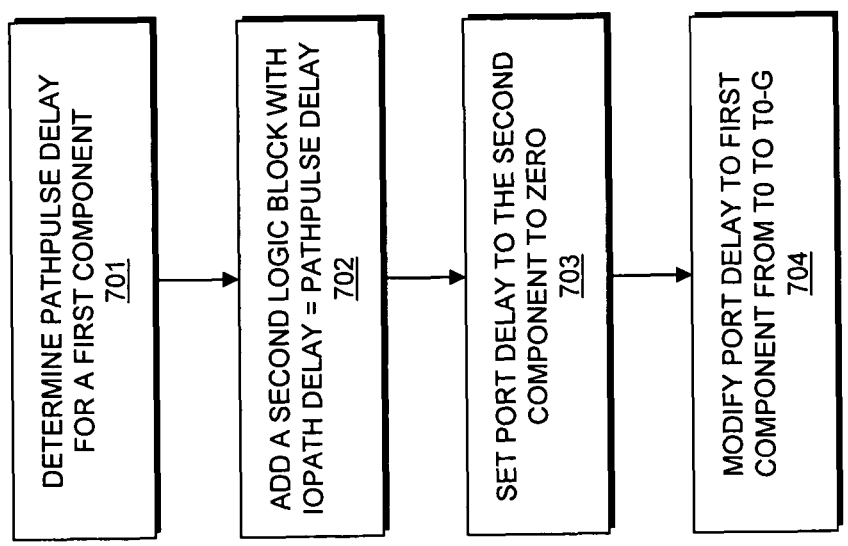

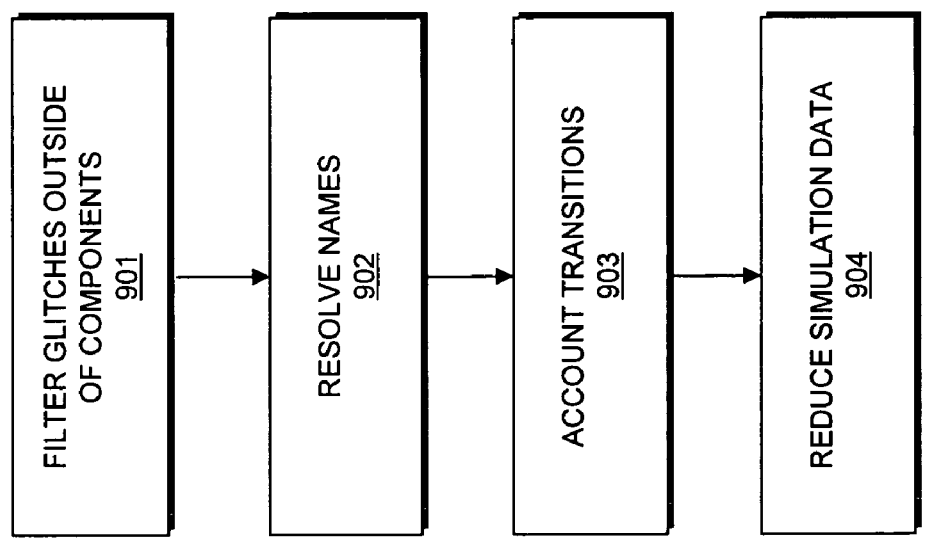

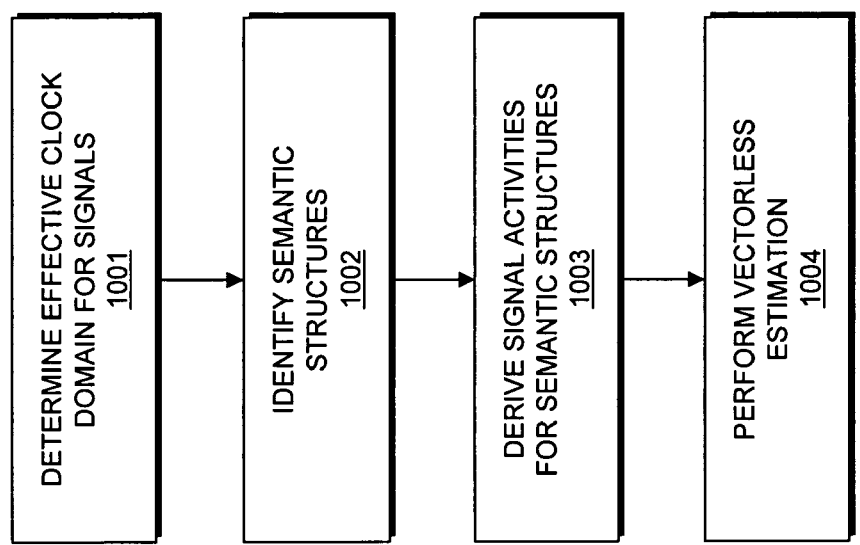

FIG. 15

| Clock Domain Identification Summary | | |
|---|---|---|
| Node | Number of Clock Domains | Clock Domain(s) |
| clk_100 | Single | clk_100 |
| clk_200 | Single | clk_200 |
| clk_400 | Single | clk_400 |
| counter[0] | Single | clk_200 |
| counter[1] | Single | clk_200 |
| counter_lut[0] | Single | clk_200 |
| counter_lut[1] | Single | clk_200 |
| data_in[0] | Single | clk_400 |
| data_in[1] | Single | clk_400 |
| data_in[2] | Single | clk_400 |
| data_in[3] | Single | clk_400 |
| data_in_reg[0] | Single | clk_400 |
| data_in_reg[1] | Single | clk_400 |
| data_in_reg[2] | Single | clk_400 |
| data_in_reg[3] | Single | clk_400 |
| mux_out | Multiple | clk_200, clk_400 |
| mux_out_reg | Single | clk_400 |
| Areset | None | N/A |
| data_out | Single | clk_400 |

| Signal Activity Priority Scheme | | |
|---|---|---|
| Node | Static Probability (Type) | Toggle Rate(Type) |
| clk_100 | 0.50 (CLOCK) | 200e6 (CLOCK) |
| clk_200 | 0.50 (CLOCK) | 400e6 (CLOCK) |
| clk_400 | 0.50 (CLOCK) | 800e6 (CLOCK) |
| counter[0] | 0.50 (VECTORLESS) | 200e6 (VECTORLESS) |
| counter[1] | 0.50 (VECTORLESS) | 100e6 (VECTORLESS) |
| counter_lut[0] | 0.50 (VECTORLESS) | 200e6 (VECTORLESS) |
| counter_lut[1] | 0.50 (VECTORLESS) | 100e6 (VECTORLESS) |
| data_in[0] | 0.50 (DEFAULT) | 50e6 (DEFAULT) |
| data_in[1] | 0.50 (DEFAULT) | 50e6 (DEFAULT) |
| data_in[2] | 0.50 (DEFAULT) | 50e6 (DEFAULT) |
| data_in[3] | 0.50 (DEFAULT) | 50e6 (DEFAULT) |
| data_in_reg[0] | 0.48 (SIMULATION) | 180e6 (SIMULATION) |
| data_in_reg[1] | 0.51 (SIMULATION) | 270e6 (SIMULATION) |
| data_in_reg[2] | 0.53 (SIMULATION) | 145e6 (SIMULATION) |
| data_in_reg[3] | 0.49 (SIMULATION) | 315e6 (SIMULATION) |
| mux_out | 0.50 (USER) | 240e6 (USER) |
| mux_out_reg | 0.50 (VECTORLESS) | 240e6 (VECTORLESS) |
| Areset | 1.00 (VECTORLESS) | 1 (VECTORLESS) |
| data_out | 0.50 (VECTORLESS) | 240e6 (VECTORLESS) |

FIG. 16

METHOD AND APPARATUS FOR DERIVING SIGNAL ACTIVITIES FOR POWER ANALYSIS AND OPTIMIZATION

RELATED APPLICATION

This application claims priority to provisional U.S. patent application Ser. No. 60/727,639, filed Oct. 17, 2005, titled "Derivation of Signal Activities for Power Analysis and Optimization", the full and complete subject matter of which is hereby expressly incorporated by reference in its entirety.

TECHNICAL FIELD

The present invention relates to the field of field programmable gate arrays (FPGAs) and other target devices. More specifically, the present invention relates to a method and apparatus for deriving signal activities that may be used for power analysis and optimization.

BACKGROUND

As system speeds and integration levels have increased in FPGAs, power dissipation has become a major design concern. Meeting a power budget has become as important as closing timing for many system designs. FPGA computer-aided design tools that can not only accurately estimate the power of a design, but also automatically optimize power during design implementation have become important in meeting today's tight power budgets.

Among the important factors in estimating power dissipation/power consumption, is the behavior of each signal in a design. Two statistics used in characterizing the behavior of signals in a design are toggle rate and static probability. The toggle rate of a signal is the average number of times that the signal changes value per unit time. The units for toggle rate are transitions per second. A transition may be seen as a change in a signal from 1 to 0 or 0 to 1. The static probability of a signal is the fraction of time that the signal is logic 1 during a period of device operation that is being analyzed. Static probability ranges from 0 (ground) to 1 (logic high). Dynamic power increases linearly with the toggle rate as the capacitive load is charged more frequently for the logic and routing. The static power consumed by both routing and logic can sometimes be affected by the static probabilities of their input signals.

In the past, simulators and vectorless estimation models were used to derive the toggle rates and static probabilities of signals. Prior simulators typically had limited support for filtering non-physical glitches. Prior vectorless estimation models were typically limited in accuracy due to their correlation assumptions. To generate accurate results for power analysis and optimization, the signal activities that are used must be representative of the actual operating behavior of the design. Inaccurate signal toggle rate data is a large source of power estimation error.

Thus, what is needed is an efficient and effective method and apparatus for deriving signal activities for power analysis and optimization.

SUMMARY

According to an embodiment of the present invention a priority scheme may be used to select signal activities derived from various sources for signal assignment. According to one aspect of the present invention, timing requirement assignments and/or inherent properties of clock generation logic may be used to derive the toggle rate for a signal. According to another aspect of the present invention, default assignments may be used to derive the toggle rate for a signal. When determining clock assignment for signals, labels may be propagated both forward and backwards through a data dependence graph.

According to an embodiment of the present invention, a design for a system is modified to allow for a path pulse filter to filter a path pulse delay, on a signal transmitted to a component, that is greater than an IO path delay. According to an aspect of the present invention, a dummy wire is inserted to modify the system.

According to an embodiment of the present invention, simulation data from a simulation file is processed to improve the quality of the data and/or to provide for better data management. According to a first aspect of the present invention, glitch filtering is performed on the simulation data. According to a second aspect of the present invention, a summary signal activities file is generated. According to a third aspect of the present invention, transition accounting is performed. According to a fourth aspect of the present invention, names are resolved.

According to an embodiment of the present invention, semantic structures are identified. A signal activity is assigned to an output of the semantic structure. Vectorless estimation is performed on non-semantic structures. According to an aspect of the present invention, the semantic structures may include an asynchronous reset pin or a counter. Signal activities may be propagated backward through the data dependency graph, i.e. from outputs of functional blocks to their inputs.

BRIEF DESCRIPTION OF THE DRAWINGS

The features and advantages of the embodiments of the present invention are illustrated by way of example and are by no means intended to limit the scope of the embodiments of the present invention to the particular embodiments shown.

FIG. 7A is a flow chart that illustrates a method for modifying a netlist for improved simulation according to an embodiment of the present invention.

FIG. 9 is a flow chart that illustrates a method for processing simulation data according to an embodiment of the present invention.

FIG. 10 is a flow chart for performing vectorless estimation according to an embodiment of the present invention.

FIG. 15 is a table that illustrates clock domain assignment for signals according to an embodiment of the present invention.

FIG. 16 is a table that illustrates signal activity assignment for signals according to an embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
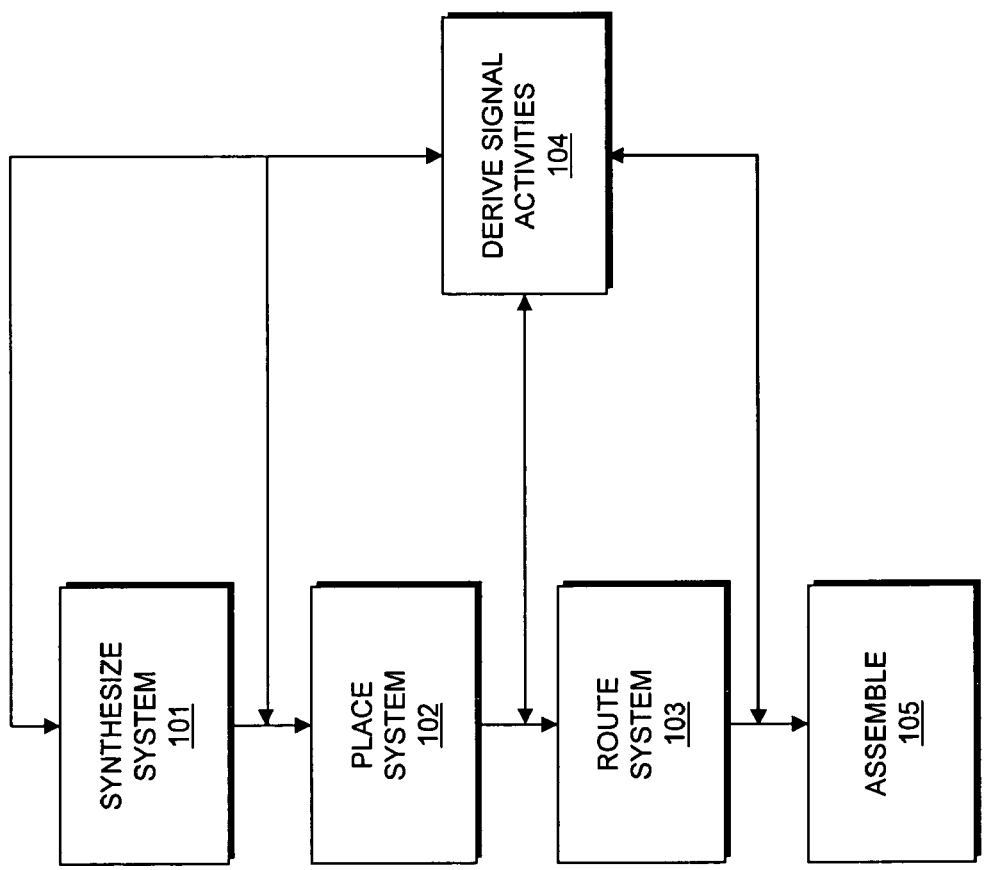
FIG. 1 is flow chart that illustrates a method for designing a system on a target device according to an embodiment of the present invention.

FIG. 1 is a flow chart illustrating a method for designing a system on a target device according to an embodiment of the present invention. The target device may be an integrated circuit such as a field programmable gate array (FPGA), a structured application specific integrated circuit (ASIC), or other circuit. At 101, the system is synthesized. Synthesis includes generating a logic design of the system to be implemented by the target device. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 102, the mapped logical system design is placed. Placement works on the optimized technology-mapped netlist to produce a placement for each of the functional blocks. According to an embodiment of the present invention, placement includes fitting the system on the integrated circuit by determining which resources on the integrated circuit are to be used for specific logic elements, and other functional blocks.

At 103 the system is routed. Routing involves determining how to connect the functional blocks in the system. According to an embodiment of the present invention, a cost function may be used to generate a cost associated with each routing option. The cost function may take into account, delay, capacitive loading, cross-sink loading, power, and/or other criteria.

At 104, signal activities are derived for the system. The signal activities for the system may include, for example, toggle rates and/or static probabilities for one or more signals in the system. The signal activities may be used for power analysis and optimization. For example, data generated from the power analysis may be used to modify previous procedures performed at 101-103 to optimize the system with regards to power consumption and/or for reporting. It should be appreciated that the derivation of signal activities may be performed after one or more of the procedures at 101-103. Information generated by one or more of the procedures at 101-103 may be used to derive the signal activities.

At 106, an assembly procedure is performed. The assembly procedure involves creating a data file or set of files that includes information determined by the fitting procedure described by 101-103. The data file may be a bit stream that may be used to program the integrated circuit or a set of layout masks used to manufacture the device.

Figure 2:
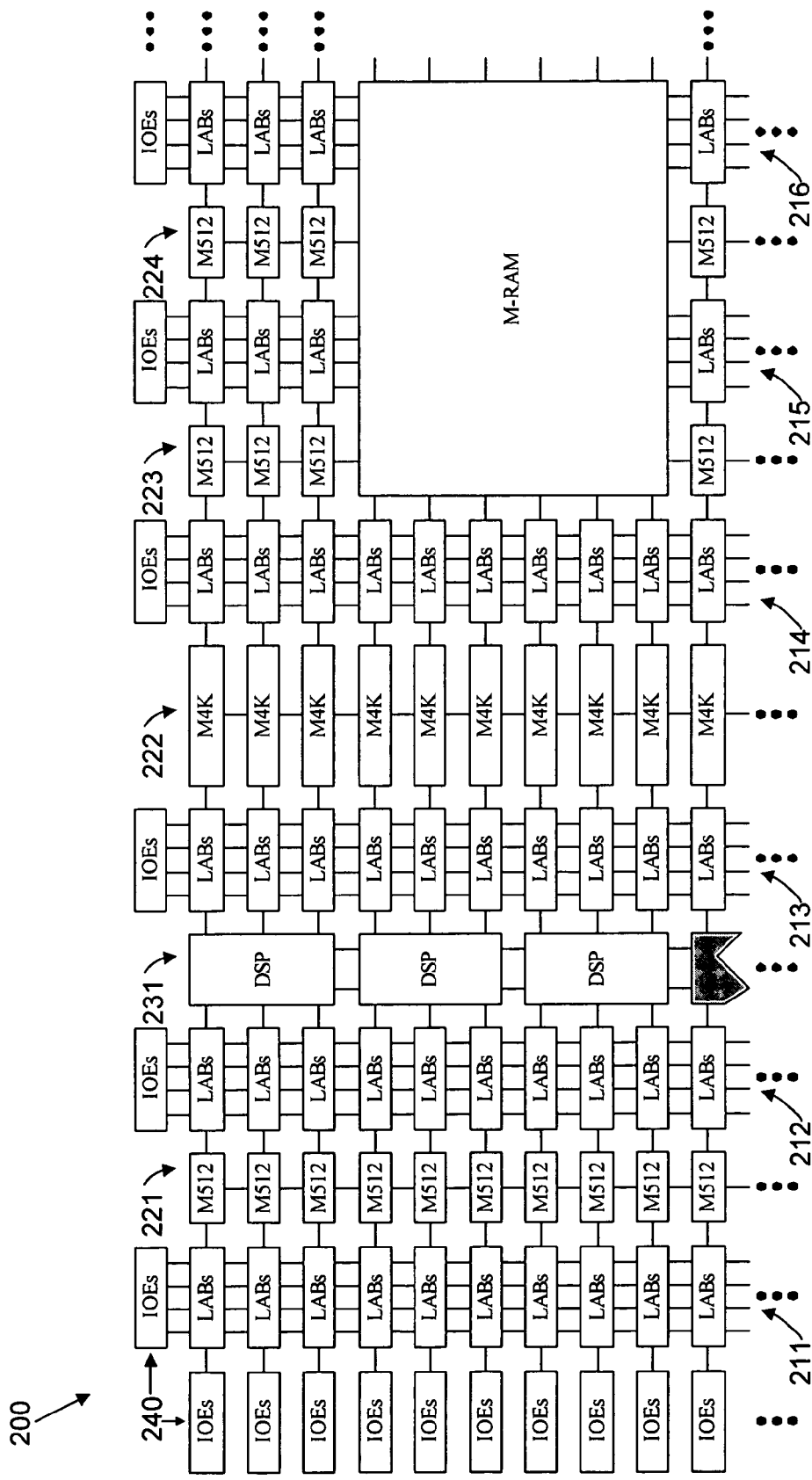
FIG. 2 illustrates a target device according to an embodiment of the present invention.

FIG. 2 illustrates an exemplary target device 200 in which a system may be implemented on utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. LABs are grouped into rows and columns across the target device 200. Columns of LABs are shown as 211-216. It should be appreciated that the logic block may include additional or alternate components.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB region. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips.

Figure 3:
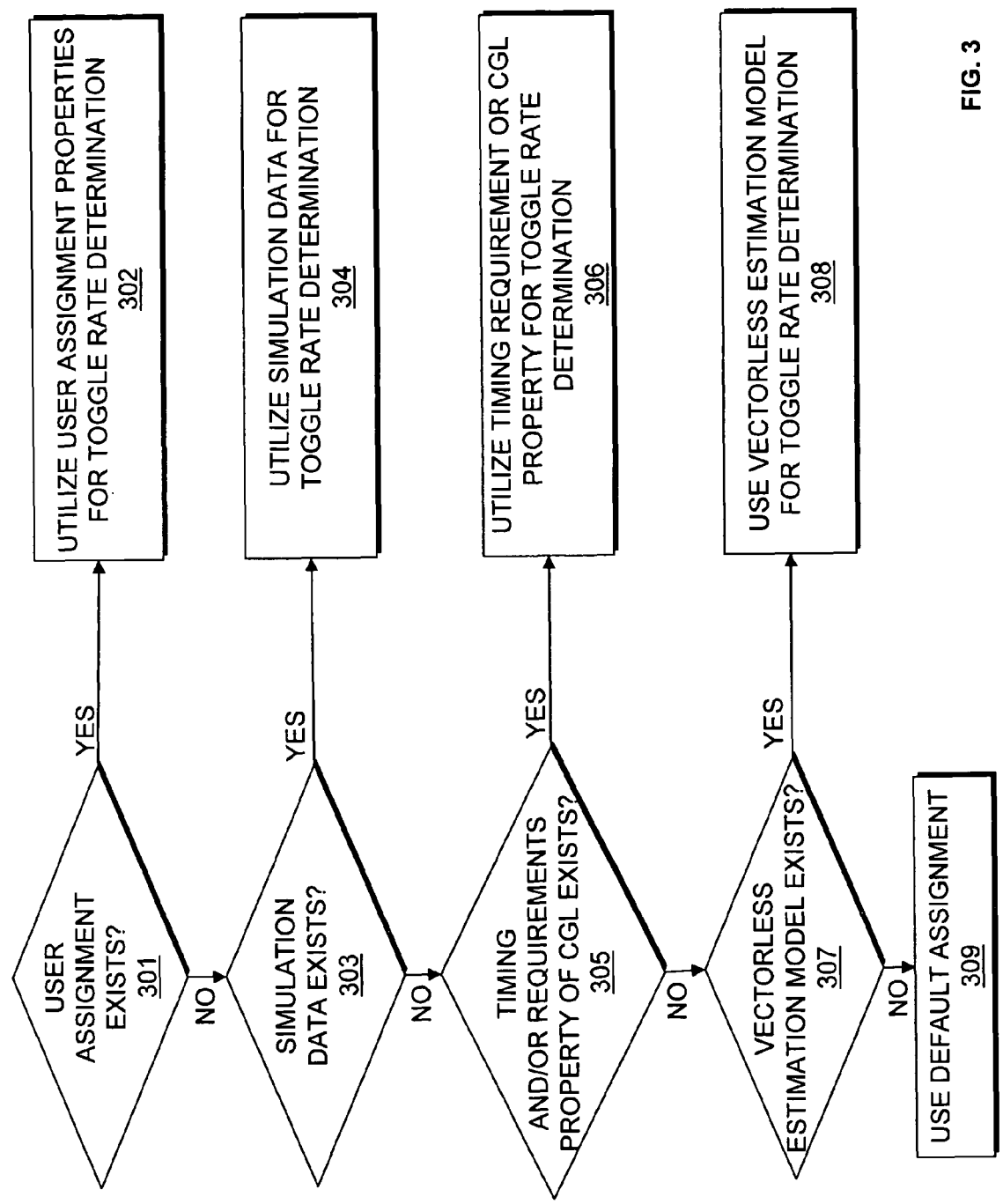
FIG. 3 is a flow chart that illustrates a method for selecting signal activity datum for a signal assignment according to an embodiment of the present invention.

FIG. 3 is a flow chart that illustrates a method for selecting signal activity datum for signal assignment according to an embodiment of the present invention. The procedure shown in FIG. 3 may be used to implement aspects of 104 shown in FIG. 1. At 301, it is determined whether user assignments exist. User assignments may include signal activities that are specified by a system designer (user). For example, a system designer may specify a specific toggle rate for a signal. If it is determined that user assignments exist, control proceeds to 302. If it is determined that user assignments do not exist, control proceeds to 303.

At 302, the user assignments available are utilized to assign signal activities for their corresponding signals.

At 303, it is determined whether simulation data exists. Simulation data may include signal activities that are derived from a sequence of values generated by a logic simulator that simulates the behavior of a system design over time. If it is determined that simulation data exists, control proceeds to 304. If it is determined that simulation data does not exist, control proceeds to 305.

At 304, the simulation data available are utilized to assign signal activities for their corresponding signals. According to an embodiment of the present invention, the simulation data may be used to assign the signal activity for a signal when user assignments are not available for that signal. In this embodiment, if user assignments exist for the signal, the user assignments are used instead.

At 305, it is determined whether timing requirement assignments for the system design or properties of clock generation logic (CGL) in the system design exist. Timing requirement assignments for the system design may include maximum frequency requirements or clock duty cycles for signals and/or components that are specified by the system designer as constraints. Clock generation logic may include components that generate or manipulate clock signals such as a phase locked-loop, delay locked-loop in FPGAs made by Altera® Corporation, or a digital clock manager from FPGAs made by Xilinx® Inc. If it is determined that timing requirements or properties of clock generation logic exist, control proceeds to 306. If it is determined that timing requirements or properties of clock generation logic do not exist, control proceeds to 307.

At 306, the timing requirement assignments or properties of clock generation logic available are utilized to assign signal activities for their corresponding signals. According to an embodiment of the present invention, a maximum frequency requirement for a signal is assigned as a toggle rate for the signal. A clock duty cycle assignment for a signal is assigned as a static probability for the signal. The timing requirements or properties of clock generation logic may be used to derive the signal activity for a signal when simulation data and user assignment are not available for that signal.

At 307, it is determined whether vectorless estimation data exists. Vectorless estimation data includes signal activities that may be derived from a class of algorithms where the system designer does not supply input vectors for simulation. If vectorless estimation data exists, control proceeds to 308. If vectorless estimation data does not exist, control proceeds to 309. According to an embodiment of the present invention, if a signal is a primary input and vectorless estimation does not recognize it as a special semantic structure, then control proceeds to 309.

At 308, the vectorless estimation data available are utilized to assign signal activities for their corresponding signals. According to an embodiment of the present invention, the vectorless estimation data may be used to derive the signal activity for a signal when simulation data, user assignment, and timing requirements or properties of clock generation logic are not available for that signal.

At 309, default user assignments are utilized to derive and assign signal activities for signals that do not have an assigned signal activity.

FIG. 3 illustrates a method for selecting signal activity datum for signal assignment where the signal activity is a toggle rate. It should be appreciated that priorty scheme illustrated in FIG. 3 may also be used for signal activities such as static probability.

Figure 4:
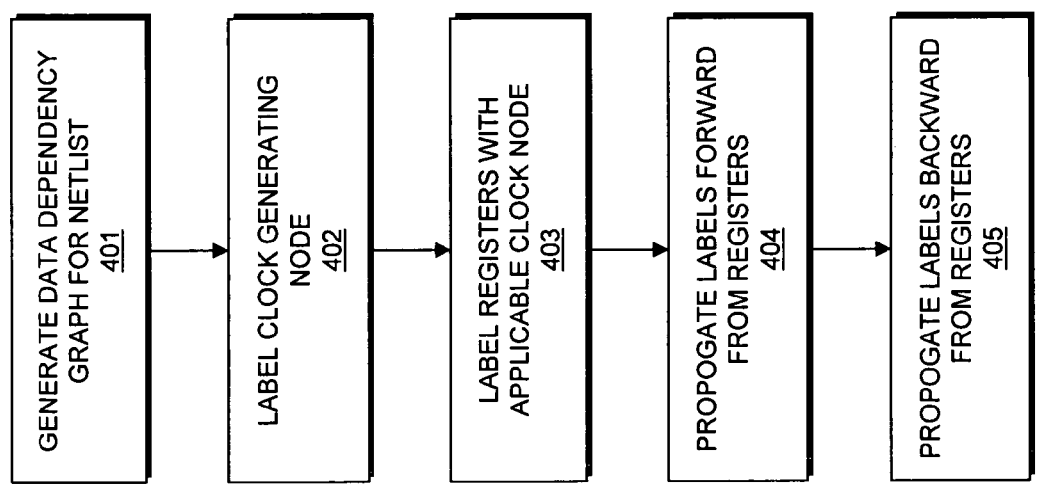
FIG. 4 is a flow chart that illustrates a method for assigning effective clock domains to signals according to an embodiment of the present invention.

FIG. 4 is a flow chart that illustrates a method for assigning effective clock domains to signals according to an embodiment of the present invention. The procedure shown in FIG. 4 may be utilized to implement aspects of 309 as shown in FIG. 3, where default assignments are used to derive signal activities, and also where a vectorless estimation model is used for toggle rate determination. At 401, a data dependency graph is generated for a system design. According to an embodiment of the present invention, the data dependency graph may be constructed from a netlist of the system design. Each node in the data dependency graph may represent a signal.

Figure 5:
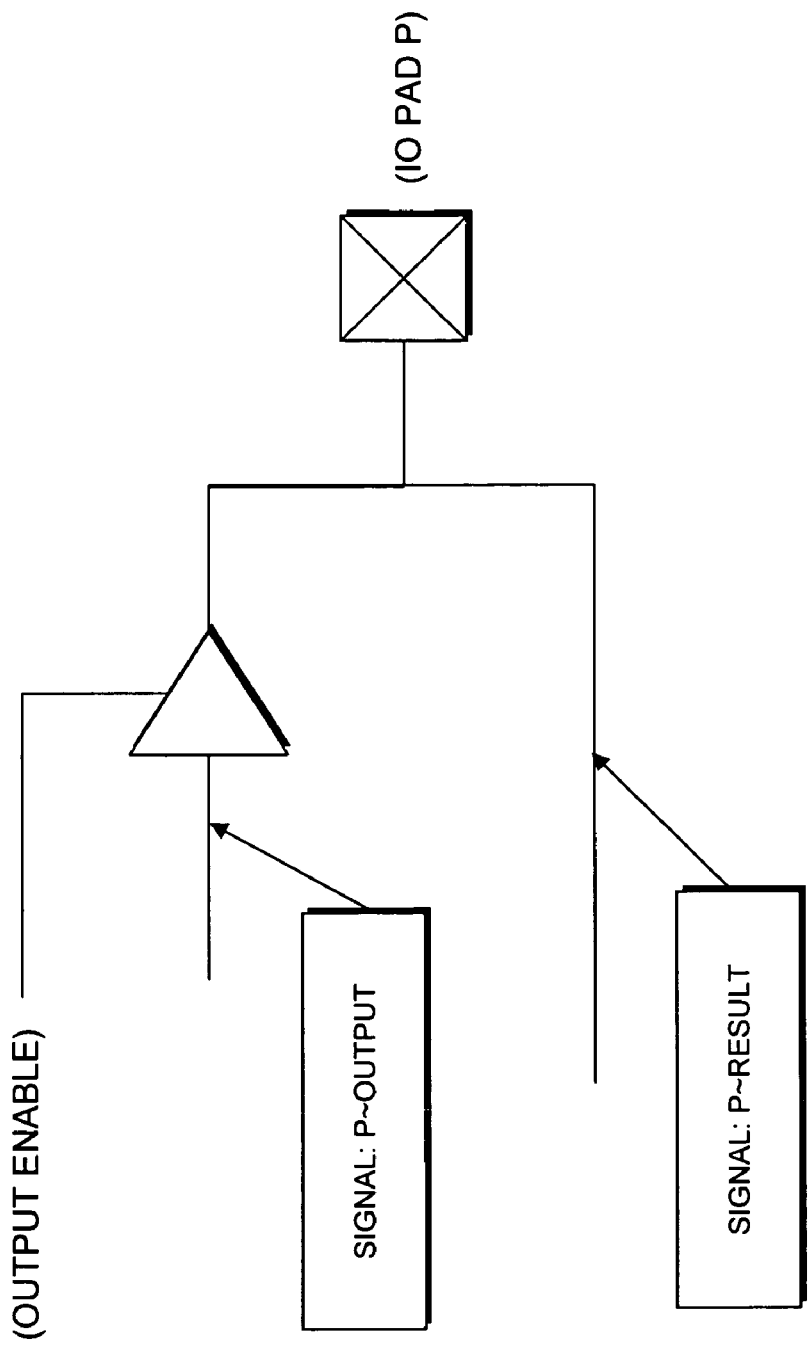
FIG. 5 illustrates the decomposition of a bidirectional pin according to an embodiment of the present invention.

According to an embodiment of the present invention a modified netlist may be used at 401 where bidirectional and differential input output (IO) pins are implemented differently for the purposes of power analysis. A bidirectional IO pin has an output path, an input path, and a tri-state buffer that arbitrates between the output path and input path. According to an embodiment of the present invention, the logic for a bidirectional IO pin is decomposed to capture a signal through the bidirectional IO pin at critical points. An observable signal P-output is created to capture the behavior of a signal assuming the output enable is active. An observable P-result is created to capture the actual arbitration between the signal driving into the bidirectional IO pin and the enabled output from within its core. FIG. 5 illustrates an embodiment of a decomposition of a bidirectional pin and its observable signal points. A differential IO pin encodes a signal by a voltage difference between signals at two pins, a positive differential pin and a negative differential pin. The two pins toggle at the same rate but have opposite values. Signal activity at the positive differential pin determines the signal activity of its associated negative pin. The toggle rates of the positive differential pin and the negative differential pin are the same. The static probability of the negative pin is 1 minus the static probability of the positive differential pin.

Referring back to FIG. 4, at 402, each clock generating node is labeled with the name of its corresponding clock node. A clock generating node represents a signal originating from a clock generation logic.

At 403, registers nodes are labeled. The register nodes represent registered signals. According to an embodiment of the present invention, a register node is given the label of the clock it is driven by.

At 404, labels are propagated forward in the data dependence graph. According to an embodiment of the present invention, the labels are propagated forward from registered nodes to combinational nodes representing combinational signals originating from combinational logic. The combinational node (output of the combinational logic) may be the union of labels on the input of the combinational logic. This procedure may be repeated until convergence is achieved. According to an embodiment of the present invention, a traversal may be performed in topological order. The propagation is stopped at each primary output or upon arriving at a registered node or arriving at a clock generating node.

At 405, labels are propagated backward in the data dependence graph. According to an embodiment of the present invention, the labels are propagated backward from registered nodes to combinational nodes. Each node output feeding an input to combinational logic accumulates all the labels that exist on the output of the combinational logic. The propagation is stopped at each primary input or upon arriving at a register node. According to an embodiment of the present invention, the propagation may also be stopped upon arriving at a clock generating node or arriving at a node that has been already visited by the forward propagation phase previously described. According to an embodiment of the present invention, the propagation may also be stopped before traversing an asynchronous input to a register, such as for example an asynchronous clear. As shown in FIG. 14F, "areset" has no clock domain label.

For 404 and 405, it should be appreciated that combinational loops may utilize special handling to avoid non-termination.

FIG. 4 illustrates a method for assigning effective clock domains to signals according to an embodiment of the present invention. Each signal in a normal synchronous path is labeled with an effective clock domain. This includes primary inputs and primary outputs of the signal. Intermediate and combinational nodes between two clock domains will also be labeled with both originating and receiving clock domains. According to an alternate embodiment of the present invention, intermediate nodes may be labeled with their originating clock domain, since backwards propagation does not occur if a node has already been visited by forward propagation. In this embodiment, forward propagation takes a higher priority than backwards propagation.

Figure 6:
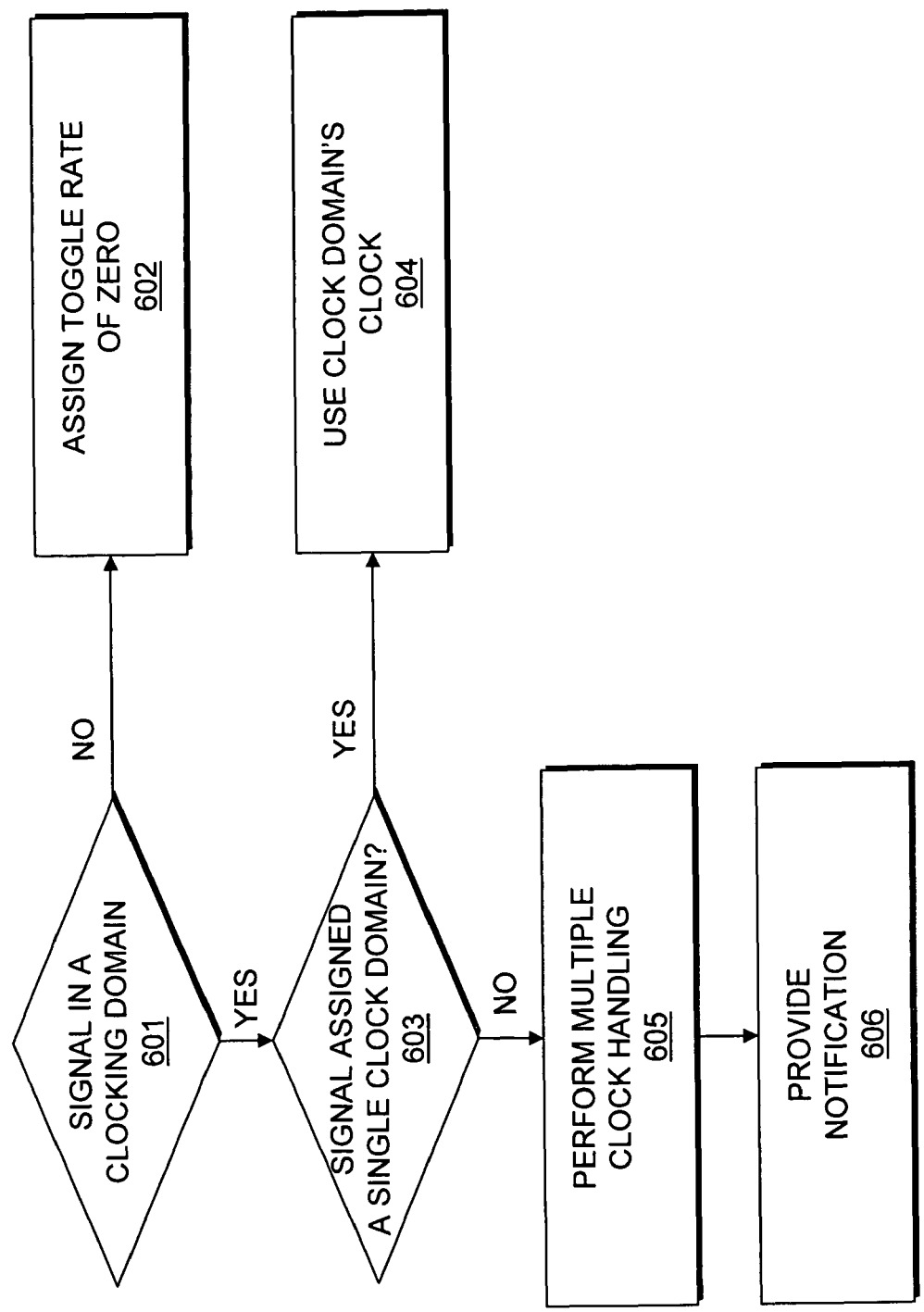
FIG. 6 is a flow chart that illustrates a method for deriving a toggle rate for a signal using default assignments according to an embodiment of the present invention.

FIG. 6 is a flow chart that illustrates a method for deriving a default toggle rate for a signal based upon a relative toggle rate specification and one or more effective clock domains associated with the signal according to an embodiment of the present invention. At 601, it is determined whether the signal has an effective clocking domain assigned to it. If the signal does not have an effective clocking domain, control proceeds to 602. If the signal has an effective an effective clocking domain, control proceeds to 603.

At 602, a toggle rate of 0 is assigned to the signal.

At 603, it is determined whether the signal is assigned a single clock domain. If the signal is assigned a single effective clock domain, control proceeds to 604. If the signal is assigned more than a single effective clock domain, control proceeds to 605.

At 604, the toggle rate of the clock associated with the clock domain is used as the basis for toggle rate calculation.

At 605, multiple clock handling is performed. According to an embodiment of the present invention, the slowest clock, fastest clock, a combinational of the clocks, or other clocking rate may be selected as the effective clock rate and used as the basis for toggle rate calculation. The selection may be based on, for example, whether a clock domain label arrived from a fanin or fanout of a node.

At 606, notification is provided to a system designer as to signals that are in multiple clock domains. According to an embodiment of the present invention, notification may also be provided for nodes that are in no clock domains.

As described with reference to FIG. 3, simulation data may be used to determine signal activities. The inertial model is one simulation model that has been used to support filtering non-physical glitches. In the inertial model, a port delay is the time for a signal to propagate through routing to the input port of a component such as a logic block. An IO path delay is the time required for the signal to propagate from the input port to an output port of the component. A pathpulse delay is the glitch filter interval (glitch interval delay) for the signal. In the inertial model, the pathpulse delay is required to be no larger than the IO path delay. This upper bound limitation reduces the utility for power analysis on system designs using FPGAs. According to an embodiment of the present invention, a design for a system is modified in order to support arbitrary glitch intervals for simulation. In this embodiment, a dummy wire is inserted where an arbitrary glitch interval is desired. The modified design is used for simulation to provide a more accurate assessment for power analysis.

FIG. 7A is a flow chart that illustrates a method for modifying a netlist for improved simulation according to an embodiment of the present invention. At 701, a pathpulse delay, G, for a first component is determined. The first component is defined with a port delay of T0 and an IO path delay of T1.

At 702, a second component (dummy component) is added. The second component is assigned an IO path delay that is equal to the pathpulse delay (G).

At 703, the port delay to the second component is set to zero.

At 704, the port delay to the first component is changed from T0 to T0 minus the pathpulse delay (T0-G).

Figure 8A:
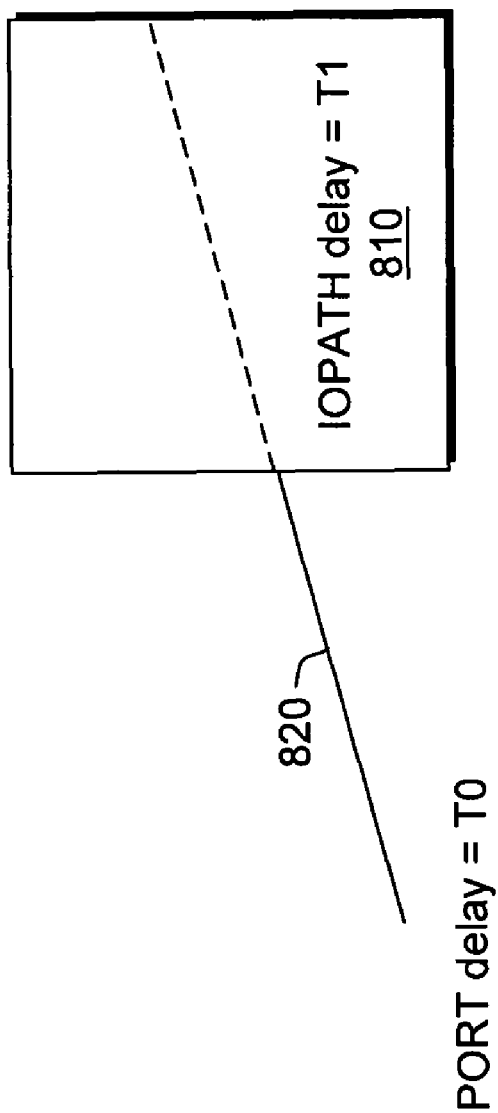
FIG. 8*a* illustrates an exemplary circuit according to an embodiment of the present invention.
Figure 8B:
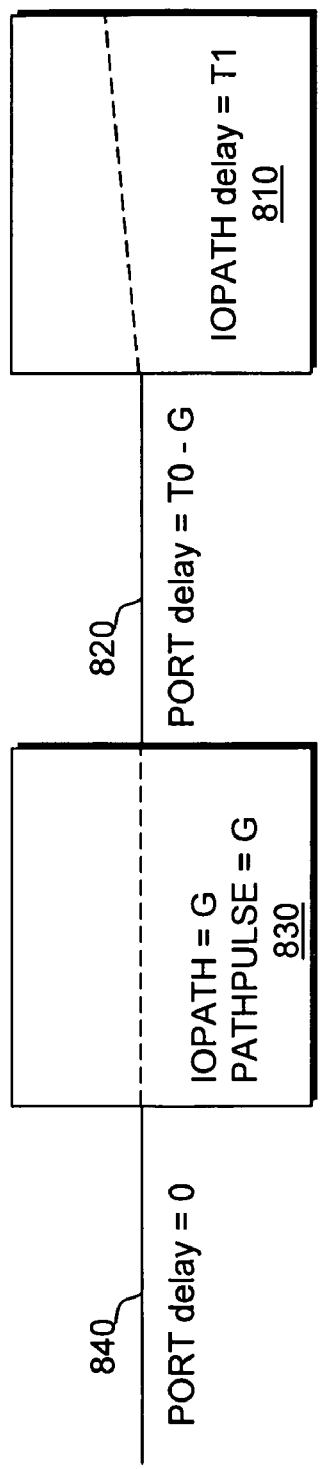
FIG. 8*b* illustrates the exemplary circuit with an inserted dummy wire according to an embodiment of the present invention.

FIG. 8a illustrates a component 810 with an IO path delay T1, and an input 820 having a port delay T0. FIG. 8b illustrate a dummy wire that is inserted. The dummy wire includes a second component (dummy component) 830 having an IO path delay equal to the desired pathpulse delay, G. The dummy wire also includes an input to the second component 840 having a port delay of 0. The port delay at the input 820 is changed to T0-G.

According to an embodiment of the present invention, an inertial simulation model may be used for the dummy wire and a transport simulation model may be used for components downstream from the dummy wire.

Figure 7B:
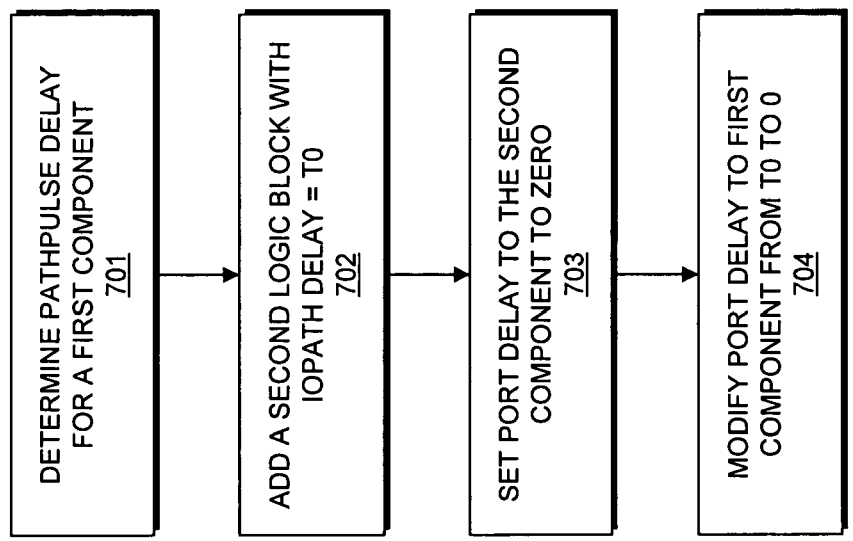
FIG. 7B is a flow chart that illustrates a method for modifying a netlist for improved simulation according to an alternate embodiment of the present invention.

FIG. 7B is a flow chart that illustrates a method for modifying a netlist for improved simulation according to an alternate embodiment of the present invention. At 701, a pathpulse delay, G, for a first component is determined. The first component is defined with a port delay of T0 and an IO path delay of T1.

At 702, a second component (dummy component) is added. The second component is assigned an IO path delay that is equal to T0 (the port delay of the first component).

At 703, the port delay to the second component is set to zero.

At 704, the port delay to the first component is changed from T0 to 0.

Glitch filtering can be performed on glitches generated inside a component. A large component may be broken up into sub-components such that the transitions at intermediate stages in the logic of the large component may be modeled. Intra-component (intra-block) hierarchical glitch filtering improves signal activity estimation and power estimation. For example, a large multiplier may be decomposed into a cascading network of adders. Each adder may compound or annihilate the transitions depending on the arrival times of the inputs. According to one embodiment, annihilation may be modeled by using a glitch filter at the output of each adder.

According to an embodiment of the present invention, after a simulator generates simulation data for a system design, the simulation data may be processed to provide further filtering, more accurate interpretation, and/or better data management. FIG. 9 is a flow chart that illustrates a method for processing simulation data according to an embodiment of the present invention. At 901, glitch filtering is performed on glitches generated at the output of components. The simulation data may be retrieved from a simulation file in a value change dump (VCD) file format. According to an embodiment of the present invention, filtering the glitch includes ignoring (filtering) pulses in the simulation file (VCD file) when the pulse width is less than a glitch filtering interval. The procedure at 901 may be used to filter a glitch on a signal represented in the simulation data present at an output of a glitch generating component.

At 902, the names of signals are resolved. According to an embodiment of the present invention, a non-simulated signal associated with a signal is identified. The non-simulated signal may be assigned simulation data associated with the signal. Identifying non-simulated signals may be achieved by pattern matching or identifying a tag annotated on the non-simulated signal.

RTL simulation produces waveforms where the names of signals are the original signal names provided by the source HDL. Synthesis and placement may remove, duplicate, or otherwise transform the names. When deriving signal activities for a post-synthesis or post-placement netlist, the current procedure may be utilized to match activities associated with original RTL names to post-synthesis or post-placement netlists. Pattern matching may be performed to identify non-simulated signals associated with replaced or generated structures. For example, logical RAMs may be replaced with physical RAM blocks whose signal names may be algorithmically derived from the original logical RAM signal names. Annotations may also be provided during synthesis, placement, and/or routing. For example, when a transformation occurs with the duplication of a structure, the duplicated structure along with is associated signals may be tagged to identify its original name.

At 903, transitions are accounted. For simulators that allow signals to take on values other than 0 and 1, such as high-impedance state (Z), and don't care state (X), heuristic accounting is performed.

The following cases are counted as 1 transition.
0->1
1->0
0->X->1
1->X->0

The following cases are counted as 0.5 transitions.
1->Z
0->Z
Z->1
Z->0
0->X->Z
1->X->Z
Z->X->1
Z->X->0

All other cases are counted as 0 transitions.

At 905, data reduction is performed on the simulation data. According to an embodiment of the present invention, a simulation file is read that represents a waveform generated by the simulator. A summary of signal activities is computed and written into a summary signal activities file. The summary of signal activities may be used for subsequent power analysis. According to an embodiment of the present invention, the summary of signal activities may include a toggle rate of the signal and/or static probability of the signal.

As described with reference to FIG. 3, vectorless estimation data may be used to determine signal activities. Vectorless estimation describes a class of algorithms where a system designer does not supply input vectors for simulation. Signal activities for the outputs of components such as LUTs, registers, multipliers, input output cells, and other components are computed by combining signal activities of the inputs to the components together with the statistical model of the component. Vectorless estimation models typically apply certain independence of correlation assumptions. For example, a common independence assumption is that the values and transitions taken by each input are statistically independent of all the other inputs to the block. Several components in a FPGA, however, do not lend themselves well to vectorless estimation models. According to an embodiment of the present invention, a method of managing vectorless estimation is disclosed in order to generate more accurate signal activities.

FIG. 10 is a flow chart that illustrates a method for managing vectorless estimation according to an embodiment of the present invention. At 1001, the effective clock domains are determined for signals in a system. According to an embodiment of the present invention, the procedure described with reference to FIG. 4 may be used to determine the effective clock domains for the signals in the system.

At 1002, semantic structures in the system are identified. The semantic structures may include a set of components that are recognized to exhibit special characteristics where the derivation of signal activities may be more suitably performed by analyzing these special characteristics instead of using a generic vectorless estimation model. According to an embodiment of the present invention, semantic structures may include asynchronous reset pins, counter structures, state machines, input output protocol structures, and other structures. These semantic structures may be identified by performing netlist traversal, tag identification, pattern matching of names, performing limited simulation on isolated portions of the netlist, and/or other procedures.

At 1003, signal activities or constraints for deriving signal activities are derived for signals originating from the identified semantic structures. According to an embodiment of the present invention where the semantic structure is a asynchronous reset pin, a low toggle rate is assigned to a reset signal and a static probability of within epsilon of the inactive level is assigned to the reset signal. According to one embodiment, a toggle rate of 1 transition per second is assigned to the reset signal and a static probability close to 1 is assigned to the reset signal. The signal activities for the reset signals may be propagated backwards through the netlist through registers and low-fanin logic gates. The signal activities may be propagated through synchronization registers to input pins.

According to an embodiment of the present invention where the semantic structure is a counter structure, a toggle rate is assigned based on an associated clock rate to the counter. For example, for a counter that adds the value 1 for each cycle, the toggle rate of bit k in the counter is $2^{-k}$ times the active clock edge rate, where k is zero for the lowest bit of the counter, and the static probability is 0.5. Similar computations may apply to carry signals and sumout signals on combinational nodes in the counter. This procedure may apply to counter structures where a general constant is added or subtracted from a counter value or where other control signals are applied to the counter structure.

According to an embodiment of the present invention where the semantic structure is a state machine, if each state of the state machine is associated with a distinct register where only one of the registers has a value 1 at any single time, constraints may be provided for performing vectorless estimation. Under normal operation, the static probabilities of the signals output by all the registers of the state machine should sum to one. Furthermore, since a state transition toggles exactly two registers in a state machine, the sum of the toggle rates of the signals output from the state machine registers is bounded above by twice the active clock edge rate. Both these constraints may be applied to override normal vectorless estimation estimates for state machine signals.

According to an embodiment of the present invention where the semantic structure is an input output protocol structure, the constraints imposed by the input output protocols are considered for deriving signal activities for signals output by the input output structures. For example, clock-data-recovery circuitry requires that signals toggle often within a sliding window of a specific bit width so that the clock signal can be recovered. The associated protocols require that data be encoded a certain way to ensure that the toggling constraint is met.

At 1004, vectorless estimation is performed taking into account the signal activities and constraints derived at 1003. According to an embodiment of the present invention, vectorless estimation models that may be applied include limited simulation techniques, transition density models, or other techniques.

Figure 11:
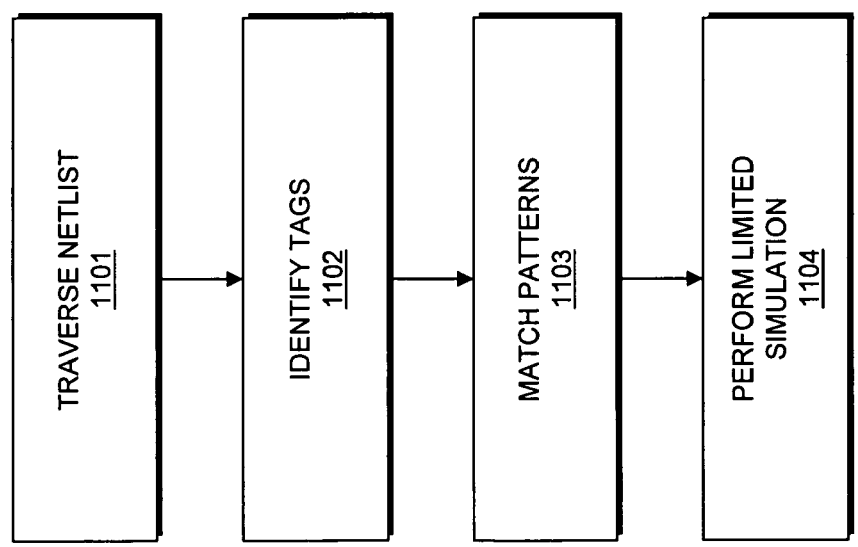
FIG. 11 is a flow chart that illustrates a method for identifying semantic structures according to an embodiment of the present invention.

FIG. 11 is a flow chart that illustrates a method for identifying semantic structures according to an embodiment of the present invention. The procedure illustrated in FIG. 11 may be utilized at 1002 shown in FIG. 10. At 1101, the netlist and meta data associated with the netlist is traversed. According to an embodiment of the present invention, traversal of the netlist may be used to identify counter structures, asynchronous reset pins, IO protocol structures, clock generation structures, state machine structures, and other structures.

At 1102, tags of semantic structures may be identified. According to an embodiment of the present invention, semantic structures may be tagged during synthesis (shown as 101 in FIG. 1). For example, state machines may be identified by recognizing case statements in I-IDL and tagged with semantic information.

At 1103, name patterns are matched. According to an embodiment of the present invention, semantic structures may be given names that conform to a particular pattern. These patterns may be used to identify the semantic structures.

At 1104, limited simulation may be performed on isolated portions of the netlist. Short, limited simulation on a subgraph of the net list may be performed to determine behavior of nodes. According to one embodiment, this may be performed during vectorless estimation when a current hypothesis about signal activities of inputs to the subgraph exists. Random vectors may be generated that conform to the current statistical hypothesis about the inputs to the subgraph.

Figure 12:
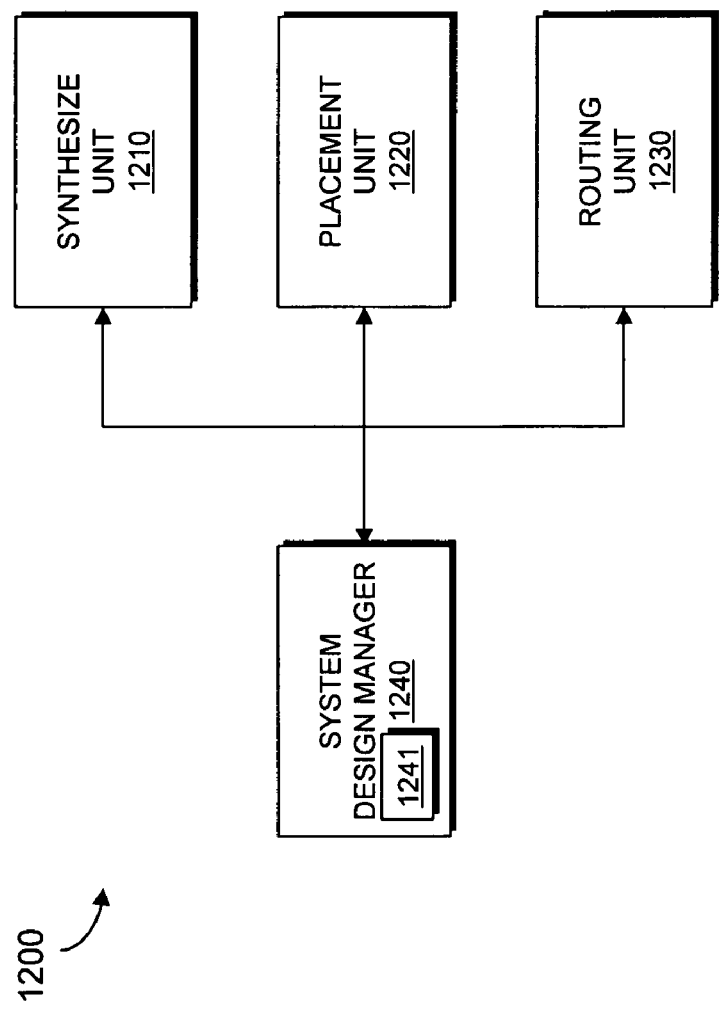
FIG. 12 illustrates a system designer according to an embodiment of the present invention.

FIG. 12 illustrates a system designer unit 1200 according to an embodiment of the present invention. The system designer unit 1200 may be an EDA tool. FIG. 12 illustrates software modules implementing an embodiment of the present invention. According to one embodiment, system design may be performed by a computer system (not shown) executing sequences of instructions represented by the software modules shown in FIG. 12. Execution of the sequences of instructions causes the computer system to support system design as will be described hereafter. In alternate embodiments, hardwire circuitry may be used in place of or in combination with software instructions to implement the system design unit 1200. Thus, the system design unit 1200 is not limited to any specific combination of hardware circuitry and software.

Block 1210 represents a synthesis unit. The synthesis unit 1210 generates a logic design of a system to be implemented by a target device. According to an embodiment of the system designer unit 1200, the synthesis unit 1210 takes a conceptual Hardware Description Language (HDL) design definition and generates an optimized logical representation of the system. The optimized logical representation of the system generated by the synthesis unit 1210 may include a representation that has a minimized number of functional blocks and registers, such as logic gates and logic elements, required for the system. Alternatively, the optimized logical representation of the system generated by the synthesis unit 1210 may include a representation that has a reduced depth of logic and that generates a lower signal propagation delay. The synthesis unit 1210 also determines how to implement the functional blocks and registers in the optimized logic representation utilizing specific resources on a target device, thus creating an optimized "technology-mapped" netlist. The technology-mapped netlist indicates how the resources on the target device can be utilized to implement the system. The technology-mapped netlist may, for example, contain components such as LEs on the target device. FIG. 2 illustrates an exemplary target device 200 in which a system may be implemented on utilizing an FPGA according to an embodiment of the present invention.

Referring back to FIG. 12, block 1220 represents a placement unit. The placement unit 1220 fits the system on the target device by determining which resources on the target device are to be used for specific functional blocks and registers. According to an embodiment of the system designer unit 1200, the placement unit 1220 first determines how to implement portions of the optimized logic design in clusters. Clusters may represent a subset of the components on the target device 200 (shown in FIG. 2) such as, for example, a LAB having a plurality of logic blocks. In this embodiment, after portions of the optimized logic design are implemented in clusters, the clusters may be placed by assigning the clusters to specific LABs on the target device. Following the placement of the clusters, routing interconnections between the logic blocks may be performed. The placement unit 1220 may utilize a cost function in order to determine a good assignment of resources on the target device.

Block 1230 represents a routing unit. The routing unit 1230 determines the routing resources on the target device to use to provide interconnection between the functional blocks and registers on the target device.

Block 1240 represents a system designer manager. The system designer manager 1240 is coupled to and transmits information between the components in the system design unit 1200. The system design manager 1240 includes a signal activity unit 1241. The signal activity unit 1241 derives signal activities for signals in the system. The signal activities for the system may include, for example, toggle rates and/or static probabilities for one or more signals in the system. The signal activities may be used for power analysis and optimization. For example, data generated from the power analysis may be used to modify previous procedures performed by the synthesis unit 1210, the placement unit 1220, and/or the routing unit 1230 in order to optimize the system with regards to power consumption or for the purpose of generating a report. It should be appreciated that the derivation of signal activities may be performed by using information generated by the synthesis unit 1210, placement unit 1220, and/or the routing unit 1230.

Figure 13:
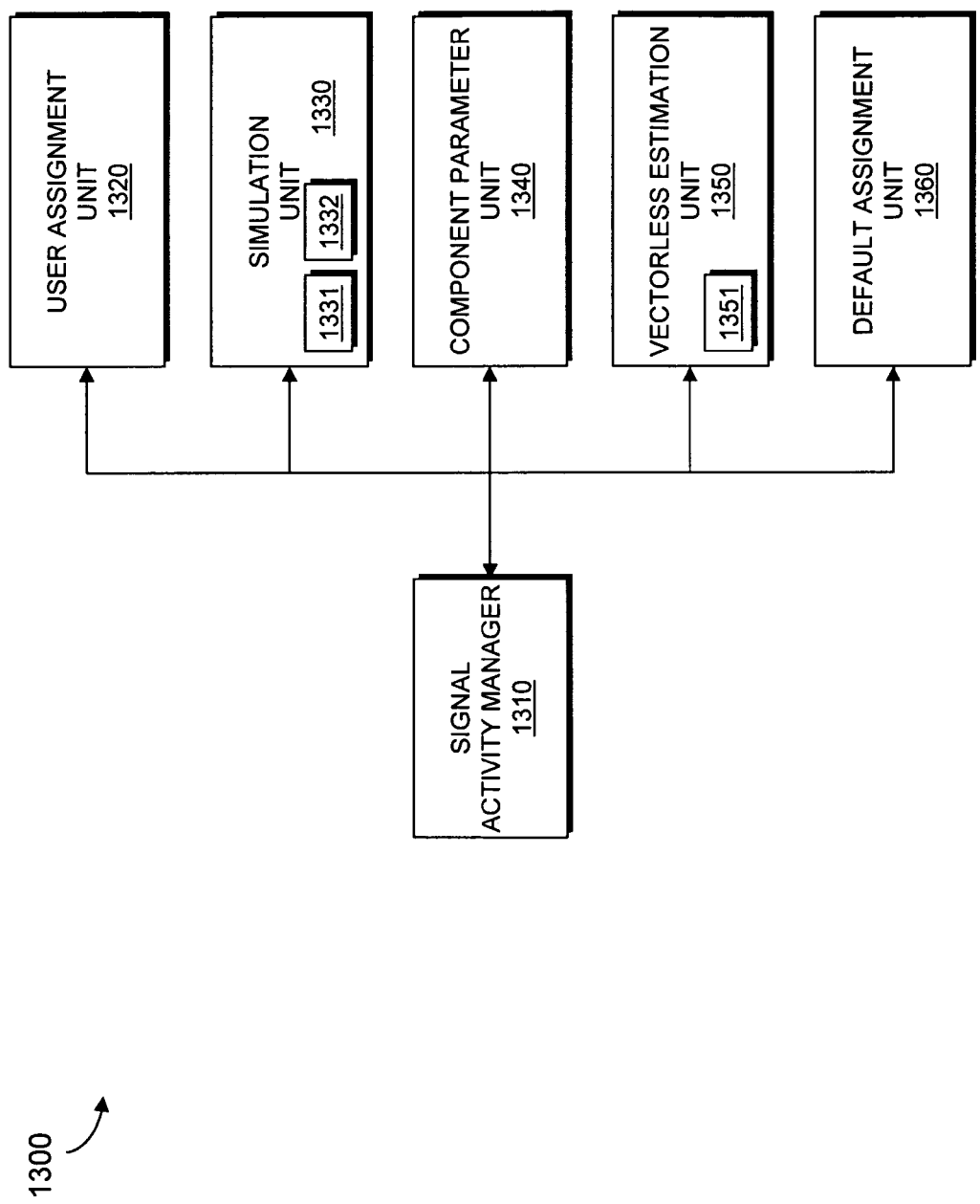
FIG. 13 illustrates a signal activity unit according to an embodiment of the present invention.

FIG. 13 illustrates a signal activity unit 1300 according to an embodiment of the present invention. The signal activity unit 1300 may be used to implement the signal activity unit 1241 shown in FIG. 12. The signal activity unit 1300 includes a signal activity manager 1310. The signal activity manager 1310 is coupled to and transmits information to other components in the signal activity unit 1300.

The signal activity unit 1300 includes a user assignment unit 1320. The user assignment unit 1320 retrieves signal activities specified for signals in a system design. The user assignment unit 1320 may retrieve toggle rate and/or static probability assignments for a signal.

The signal activity unit 1300 includes a simulator unit 1330. The simulator unit 1330 may interface with or include a simulator that generates simulation data for a system design. The simulator unit 1330 includes a filtering unit 1331. The filtering unit 1331 modifies a design to allow for a path pulse filter used by a simulator to filter a path pulse delay, on a signal transmitted to a component, that is greater than an IO path delay. The filtering unit 1331 may insert a dummy wire to an input of the component that includes a dummy component having an IO path delay equal to the path pulse delay, and an input having a port delay of zero. According to an embodiment of the simulator unit 1330, the filtering unit 1331 may perform the procedures described with reference to FIG. 7.

The simulator unit 1330 also includes a simulation data processor 1332. The simulation data processor 1332 may perform a variety of tasks on simulation data generated by a simulator. In one embodiment, the simulation data processor 1332 may retrieve simulation data from a simulation file, and filter a glitch on a signal represented in the simulation data at an output of a glitch generating component. The simulation data processor 1332 may account for a transition between a 0 or 1 state through a do not care state as a single transition for the signal, and account for a transition between a high-impedance state and a 0 or 1 state as a half a transition for the signal. It should be appreciated that the simulation data processor 1332 may perform one or more of the procedures described with reference to FIG. 9.

The signal activity unit 1300 includes a component parameter unit 1340. The component parameter unit 1340 retrieves parameters from components that may be used to derive signal activities. According to one embodiment of the signal activity unit 1300, the component parameter unit 1340 retrieves maximum frequency and duty cycle parameters associated with a component that is a clock generating logic to derive a toggle rate and static probabilities for a signal from the clock generating logic.

The signal activity unit 1300 includes a vectorless estimation unit 1350. The vectorless estimation unit 1350 may interface or include an entity that performs vectorless estimation. The vectorless estimation unit 1350 includes a semantic structure unit 1351. According to an embodiment of the vectorless estimation unit 1350, the semantic structure unit 1351 includes a semantic structure identifier unit to identify semantic structures in a system design. The semantic structure unit 1351 may include a semantic structure signal activity unit to derive signal activities for signals output from semantic structures, and a semantic structure constraint unit to identify a constraint for a signal activity of a signal output from a semantic structure. According to an embodiment of the vectorless estimation unit 1350, the semantic structure unit 1351 may perform the procedures described with reference to FIGS. 10 and 11.

The signal activity unit 1300 includes a default assignment unit 1360. The default assignment unit 1360 may associate a clocking domain with a signal and determine an appropriate signal activity to assign to the signal. According to an embodiment of the signal activity unit 1300, the default assignment unit 1360 may perform the procedures described with reference to FIGS. 4-6.

The signal activity manager 1310 assigns a signal activity derived by the components in the signal activity unit 1300 according to a priority scheme. According to an embodiment of the signal activity unit 1300, the signal activity manager 1310 may perform the procedures described with reference to FIG. 3.

Figure 14A:
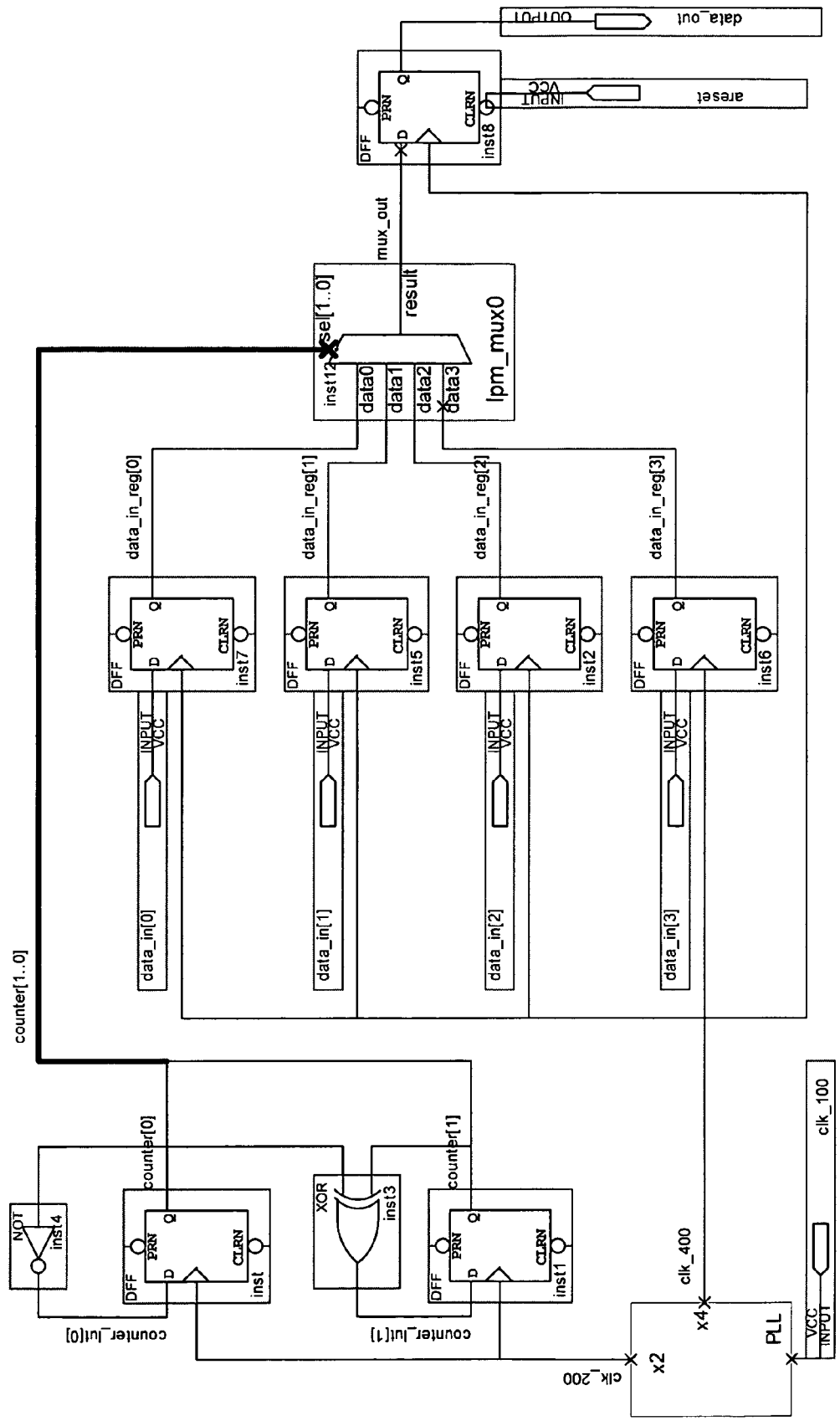
FIG. 14a illustrates an exemplary system according to an embodiment of the present invention.

FIG. 14a illustrates an exemplary system according to an embodiment of the present invention. In this example, the following user assignments are provided.

Figure 14B:
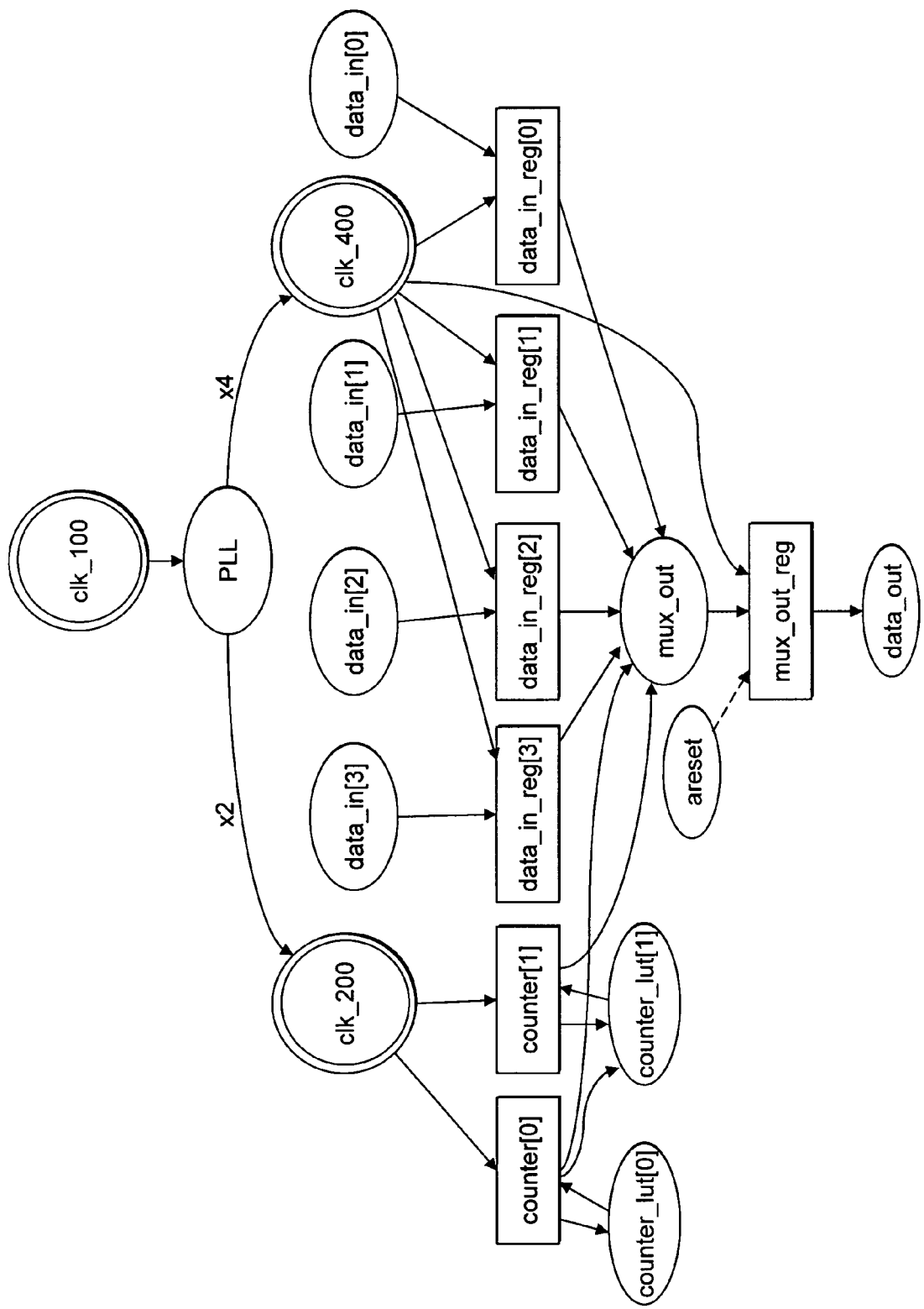
FIG. 14b illustrates a data dependency graph of the system according to an embodiment of the present invention.

Clock Frequency Assignment on clk_100 of 100 MHz
Static Probability Assignment of 0.5 on mux_out
Toggle Rate Assignment of 240 million transitions/s on mux_out In addition, the following simulation results are provided from simulation data generated by a simulator.

data_in[0]
    static probability=0.48
    toggle rate=180 million transitions/s
data_in[1]
    static probability=0.51
    toggle rate=270 million transitions/s
data_in[2]
    static probability=0.53
    toggle rate=145 million transitions/s
data_in[3]
    static probability=0.49
    toggle rate=315 million transitions/s In order to determine the clocking domain associated with signals in the system, the procedure described in FIG. 4 may be utilized. With reference to FIG. 4, at 401 a data dependence graph is constructed. FIG. 14b illustrates a data dependency graph of the system according to an embodiment of the present invention. The nodes (represented with circles, rectangles, and ovals) are signals output from components in the system.

Figure 14C:
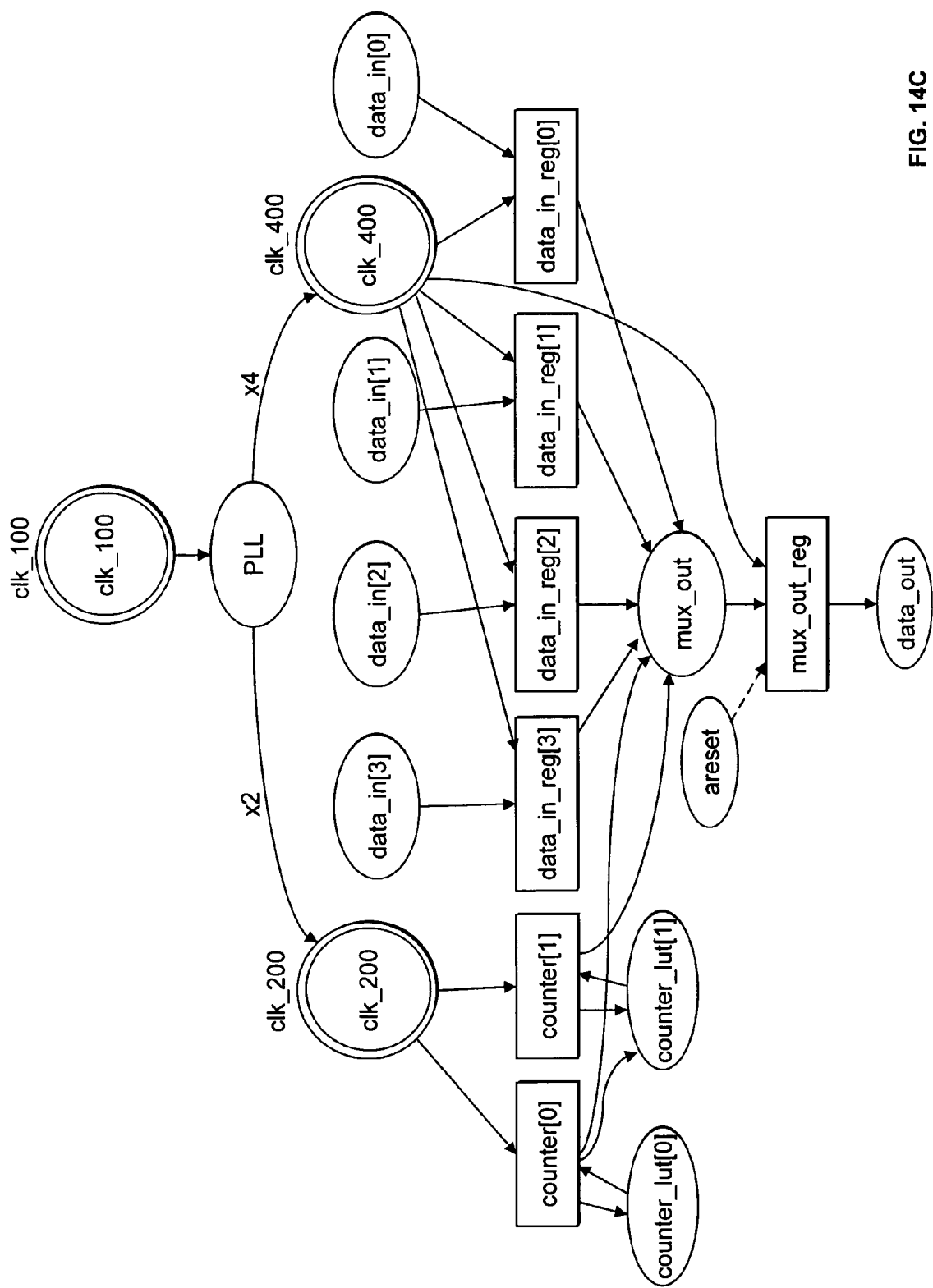
FIG. 14c illustrates the data dependency graph with labeled clock generating nodes according to an embodiment of the present invention.

At 402, clock generating nodes are labeled. FIG. 14c illustrates the data dependency graph with labeled clock generating nodes according to an embodiment of the present invention.

Figure 14D:
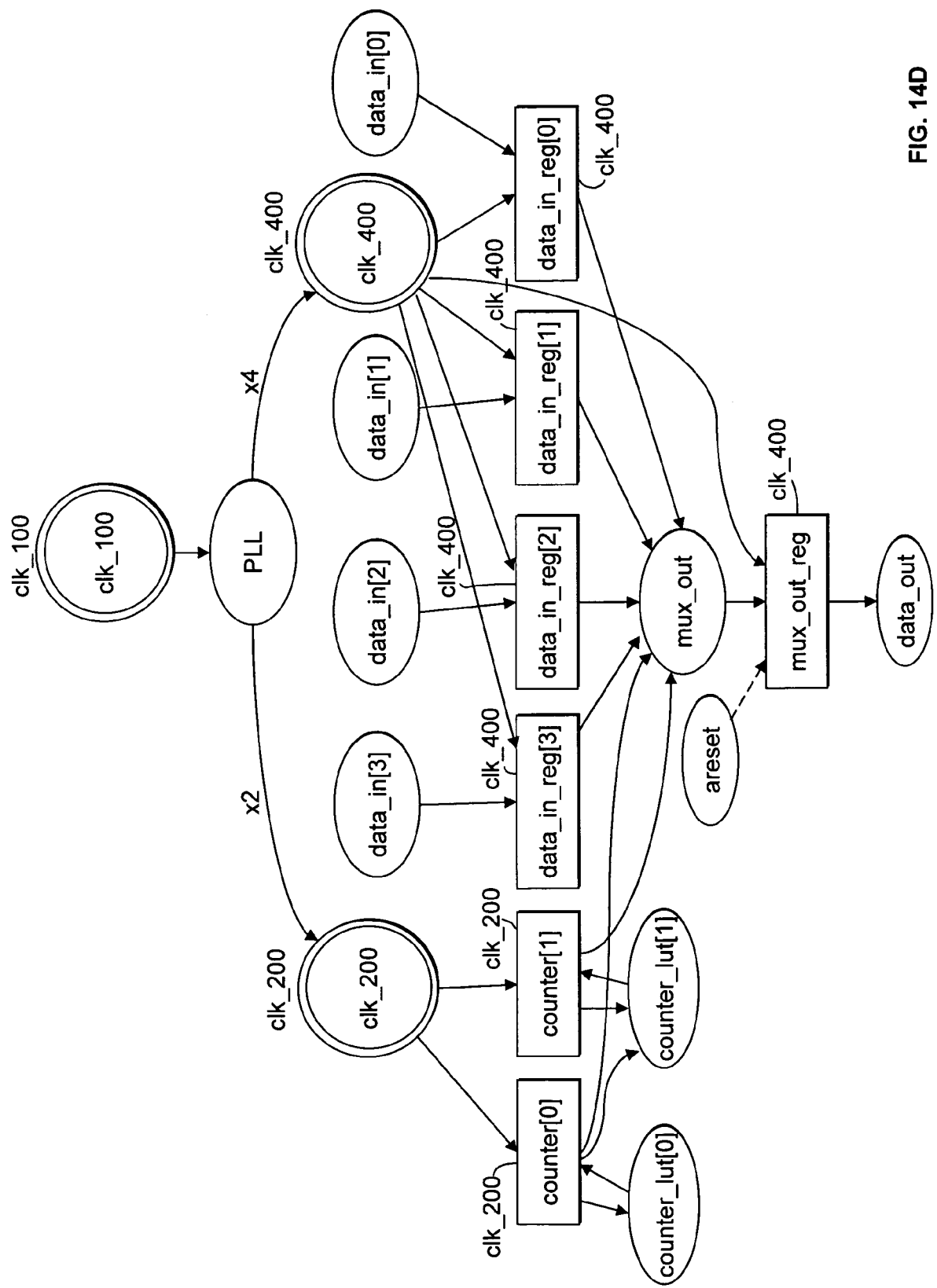
FIG. 14d illustrates the data dependency graph with labeled register outputs according to an embodiment of the present invention.

At 403, register outputs are labeled with the register clock. FIG. 14d illustrates the data dependency graph with labeled register outputs according to an embodiment of the present invention.

Figure 14E:
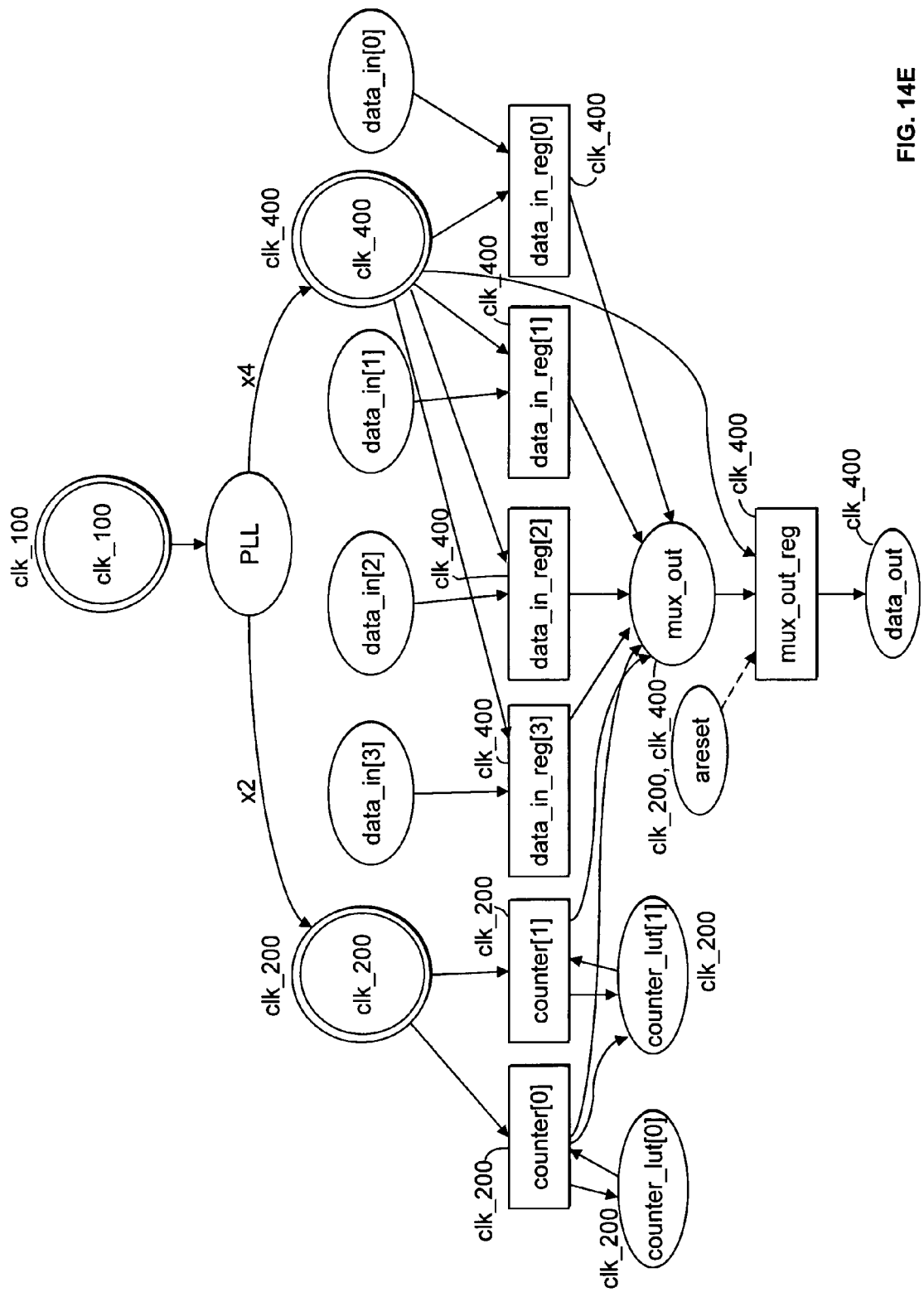
FIG. 14e illustrates the data dependency graph with labeled register fanouts according do an embodiment of the present invention.
Figure 14F:
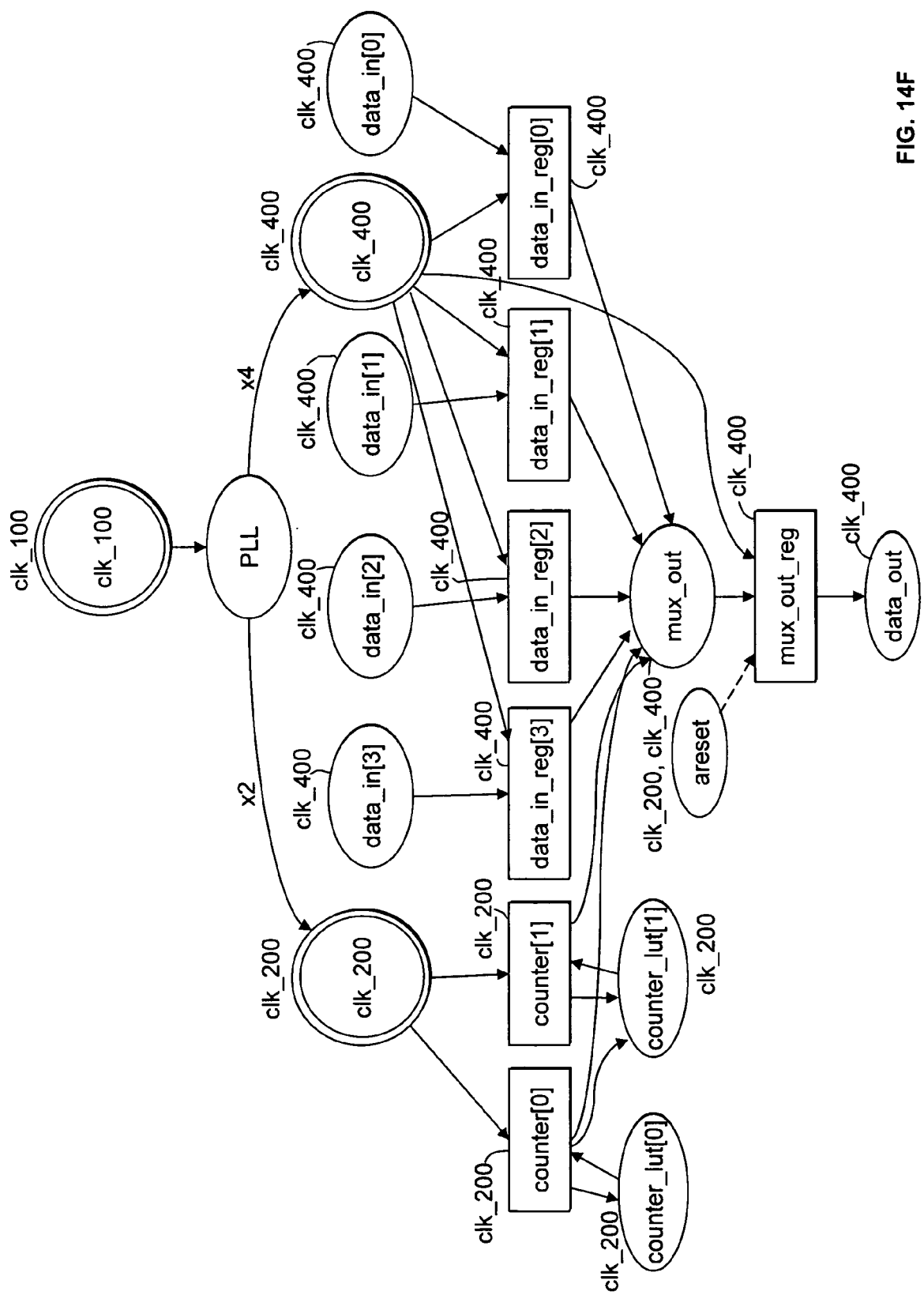
FIG. 14f illustrates the data dependency graph with labeled register fanins according to an embodiment of the present invention.

At 404, signals are propagated forward so that register fanouts are labeled with register clock labels. FIG. 14e illustrates the data dependency graph with labeled register fanouts according to an embodiment of the present invention.

At 405, signals are propagated backward so that register fanins are labeled with register clock labels. FIG. 14f illustrates the data dependency graph with labeled register fanins according to an embodiment of the present invention.

By performing the procedure shown in FIG. 4, clock domain assignments may be made for all of the signals in the exemplary system. FIG. 15 is a table that illustrates clock domain assignment for signals of the system according to an embodiment of the present invention.

The procedure shown in FIG. 3 may be utilized for selecting signal activity datum to assign signal activities according to an embodiment of the present invention. In this example, user assignments are used first. Simulation data is used second. Clock settings are used third. Without vectorless estimation data, default assignments are used fourth. FIG. 16 is a table that illustrates signal activities assigned for signals according to an embodiment of the present invention. In this embodiment, signal assignments were made utilizing the priority scheme illustrated in FIG. 3.

FIGS. 1, 3-4, 6-7, and 9-11 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention may be provided as a computer program product or software that may include an article of manufacture on a machine accessible or a machine readable medium having instructions. The instructions on the machine accessible medium may be used to program a computer system or other electronic device. The machine accessible medium may include, but is not limited to, floppy diskettes, optical disks, CD-ROMs, magneto-optical disks, or other types of media/machine accessible medium suitable for storing or transmitting electronic instructions. The techniques described herein are not limited to any particular software configuration. They may find applicability in any computing or processing environment. The term "machine accessible medium" used herein shall include any medium that is capable of storing, encoding, or transmitting a sequence of instructions for execution by the machine and that causes the machine to perform any one of the methods described herein. Furthermore, it is common in the art to speak of software, in one form or another (e.g. program, procedure, process, application, module, unit, logic, and so on) as taking an action or causing a result. Such expressions are merely a shorthand way of stating that the execution of the software by a processing system causes the processor to perform an action to produce a result.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for generating a design of a system to be implemented on a target device, comprising:
identifying a semantic structure;
assigning a signal activity to an output of the semantic structure that describes a toggle rate of the semantic structure according to a characteristic of the semantic structure;
performing vectorless estimation on a non-semantic structure to determine a signal activity that describes a toggle rate of the non-semantic structure; and
optimizing power for the design of the system according to the signal activity of the semantic structure and the signal activity of the non-semantic structure by modifying one of synthesis, placement, and routing of the system on the target device, wherein at least one of the identifying, assigning, performing, and optimizing procedures is performed by a computer.

2. The method of claim 1, wherein identifying the semantic structure comprises traversing a netlist.

3. The method of claim 1, wherein identifying the semantic structure comprises identifying a tag associated with the semantic structure.

4. The method of claim 1, wherein identifying the semantic structure comprises performing pattern matching on a name of the semantic structure.

5. The method of claim 1, wherein identifying the semantic structure comprises performing a limited simulation on an isolated portion of a netlist.

6. The method of claim 1, wherein assigning the signal activity to the output of the semantic structure comprises assigning a low toggle rate to a reset signal when the semantic structure is an asynchronous reset pin.

7. The method of claim 1, wherein assigning the signal activity to the output of the semantic structure comprises assigning a toggle rate based on an associated clock rate to the semantic structure when the semantic structure is a counter.

8. The method of claim 1, further comprising:
identifying a second semantic structure;
identifying a constraint for deriving a signal activity of a signal output from the second semantic structure; and performing vectorless estimation on the second semantic structure utilizing the constraint.

9. The method of claim 8, wherein the second semantic structure is a counter structure.

10. The method of claim 8, wherein the second semantic structure is an input output protocol structure.

11. The method of claim 8, wherein the second semantic structure is a state machine.

12. The method of claim 1, further comprising optionally assigning a signal activity to an input of the semantic structure.

13. A non-transitory a machine accessible storage medium including sequences of instructions, the sequences of instructions including instructions which when executed cause the machine to perform:
 identifying a semantic structure;
 applying a constraint for deriving a signal activity of a signal output from the semantic structure according to a characteristic of the semantic structure; and
 performing vectorless estimation on the semantic structure utilizing the constraint to determine the signal activity that describes a toggle rate for the signal output from the semantic structure and optimizing power for the design of the system according to the signal activity of the semantic structure by modifying one of synthesis, placement, and routing of the system on the target device.

14. The article non-transitory machine accessible storage medium of claim 13, wherein the semantic structure is a counter structure.

15. The article non-transitory machine accessible storage medium of claim 13, wherein the semantic structure is an input output protocol structure.

16. The article non-transitory machine accessible storage medium of claim 13, further comprising instructions which when executed causes the machine to perform:
 identifying a second semantic structure;
 assigning a signal activity to an output of the second semantic structure; and
 performing vectorless estimation on non-semantic structures.

17. The article non-transitory machine accessible storage medium of claim 16, wherein assigning the signal activity to the output of the semantic structure comprises assigning a low toggle rate to a reset signal when the semantic structure is an asynchronous reset pin.

18. The article non-transitory machine accessible storage medium of claim 16, wherein assigning the signal activity to the output of the semantic structure comprises assigning a toggle rate based on an associated clock rate to the semantic structure when the semantic structure is a counter.

19. The article non-transitory machine accessible storage medium of claim 13, further comprising instructions which when executed causes the machine to optionally assign a signal activity to an input of the second semantic structure.

20. An apparatus implemented in hardware, comprising:
 a semantic structure identifier unit to identify semantic structures in a system design; and
 a semantic structure signal activity unit to derive signal activities for signals output from semantic structures or input to semantic structures that describes toggle rates of the semantic structures according to a characteristic of the semantic structure; and a system design manager to coordinate optimizing power for the design of the system according to the signal activity of the semantic structure by modifying one of synthesis, placement, and routing of the system on the target device.

21. The apparatus of claim 20, further comprising a semantic structure constraint unit to identify a constraint for a signal activity of a signal output from a semantic structure.

22. The apparatus of claim 20, wherein the semantic structure identifier unit identifies asynchronous reset pins.

23. The apparatus of claim 20, wherein the semantic structure identifier unit identifies counter structures.

24. The apparatus of claim 20, wherein the semantic structure identifier unit identifies state machines.

25. The apparatus of claim 20, wherein the semantic structure identifier unit identifies input output protocol structures.

26. The method of claim 1, wherein signal activities are propagated backwards during vectorless estimation.

27. An apparatus implemented in hardware, comprising:
 a semantic structure identifier unit to identify semantic structures in a system design;
 a semantic structure signal activity unit to derive signal activities for signals output from semantic structures or input to semantic structures that describes toggle rates of the semantic structures, wherein the semantic structures are asynchronous reset pins; and
 a system design manager to coordinate optimizing power for a design of the system according to the signal activity of the semantic structures by modifying one of synthesis, placement, and routing of the system on a target device.

28. The apparatus of claim 27, further comprising a semantic structure constraint unit to identify a constraint for a signal activity of a signal output from a semantic structure.

29. The apparatus of claim 27, wherein the semantic structure identifier unit identifies the semantic structure by traversing a netlist.

* * * * *